United States Patent [19]

Subramanian

[11] Patent Number: 5,264,414
[45] Date of Patent: Nov. 23, 1993

[54] SUPERCONDUCTING METAL OXIDE (TL,BI)$_1$SR$_2$CA$_2$CU$_3$O$_y$ COMPOSITIONS AND PROCESSES FOR MANUFACTURE

[75] Inventor: Munirpallam A. Subramanian, New Castle, Del.

[73] Assignee: E. I. Du Pont de Nemours and Company, Wilmington, Del.

[21] Appl. No.: 951,247

[22] Filed: Sep. 25, 1992

Related U.S. Application Data

[63] Continuation of Ser. No. 593,581, Oct. 1, 1990, abandoned, which is a continuation of Ser. No. 390,944, Aug. 8, 1989, abandoned.

[51] Int. Cl.$^5$ .................. C01F 11/02; C01G 3/02; C01G 15/00; H01L 39/12
[52] U.S. Cl. .................................. 505/1; 252/521; 505/782; 505/783
[58] Field of Search ............... 505/1, 782, 783; 252/521

[56] References Cited

PUBLICATIONS

Torii et al., Jpn. J. Appl. Phys. 28(7), L1190 (1989) Jul. 1989.
Inoue et al., Jpn. J.Appl. Phys. 28(7), L1167 (1989) Jul. 1989.
Wheatley et al., Nature, vol. 333, 121 (1988) May 12, 1988.
Haldar et al., Mater. Lett. 7, 1 (1988) Aug. 1988.
Haldar et al., J. Superconduct. 1, 21 (1988) no month provided.
Chen et al., J. Appl. Phys. 65, 3574 (1989) May 1, 1979.
Li et al., Physica C 157, 365 (1989) no month provided.
Bednorz et al., Z. Phys. B64, 189 (1986) no month provided.
Rao et al., Current Science 56, 47 (1987) Jan. 1987.
Chu et al., Science 235, 567 (1987) Jan. 1987.
Chu et al., Phys. Rev. Lett. 58, 405 (1987) Jan. 1987.
Cava et al., Phys. Rev. Lett. 58, 408 (1987) Jan. 1987.
Bednorz et al., Europhys. Lett. 3, 379 (1987) Feb. 1987.
Wu et al., Phys. Rev. Lett. 58, 908 (1987) Mar. 1987.
Cava et al., Phys. Rev. Lett. 58, 1676 (1987) Apr. 1987).
Michel et al., Z. Phys. B–Condensed Matter 68, 421 (1987) Oct. 1987.
Maeda et al., Jpn. J. Appl. Phys. 27, L209 (1988) Feb. 1988.
Subramanian et al., Science 239, 1015 (1989) Feb. 1988.
Yamada et al., Jpn. J. Appl. Phys. 27, L996 (1988) Jun. 1988.
Takano et al., Jpn. J. Appl. Phys. 27, L1041 (1988) Jun. 1988.
Mizuno et al., Jpn. J. Appl. Phys. 27, L1225 (1988) Jul. 1988.
Sampathkumaran et al., J. Phys. F: Met. Phys. 18, L163 (1988) no month provided.
Sheng et al., Nature 332, 55 (1988) Mar. 1958.
Sheng et al., Nature 332, 138 (1988) Mar. 1988.
Hazen et al., Phys. Rev. Lett. 60, 1657 (1988) Apr. 1988.

Primary Examiner—Paul Lieberman
Assistant Examiner—John Boyd

[57] ABSTRACT

Compositions having the formula Tl$_{1-x}$Bi$_x$Sr$_2$Ca$_2$Cu$_3$O$_9$ wherein x is from about 3/20 to about 11/20 are superconducting with transition temperatures above 110 K. Processes for making and using the compositions of the invention are provided.

9 Claims, 4 Drawing Sheets

FIG. 4

| d-spacing (nm) | Intensity | hkl |
| --- | --- | --- |
| 1.5250 | w | 001 |
| 0.7650 | w | 002 |
| 0.5100 | m | 003 |
| 0.3825 | s | 004 |
| 0.3714 | w | 101 |
| 0.3417 | m | 102 |
| 0.3062 | s | 103 |
| 0.2707 | vs | 104, 110 |
| 0.2659 | w | 119 |
| 0.2555 | s | 006 |
| 0.2389 | s | 105 |
| 0.2187 | s | 007 |
| 0.2120 | w | 106 |
| 0.2029 | m | 115 |
| 0.1912 | s | 008 |
| 0.1897 | m | 201 |
| 0.1854 | m | 202 |
| 0.1712 | m | 108 |
| 0.1701 | s | 009 |
| 0.1670 | w | 212 |
| 0.1622 | m | 205, 213 |
| 0.1562 | s | 118 |

SUPERCONDUCTING METAL OXIDE (TL,BI)₁SR₂CA₂CU₃O$_y$ COMPOSITIONS AND PROCESSES FOR MANUFACTURE

This is a continuation of application Ser. No. 07/593.581, filed Oct. 1, 1990 now abandoned, which is a continuation of application Ser. No. 07/390,944 filed Aug. 8, 1989, now abandoned.

BACKGROUND OF THE INVENTION

1. Field of the Invention

This invention relates to novel Tl-Bi-Sr-Ca-Cu-O single phase compositions which are superconducting.

2. References

Bednorz and Muller, Z. Phys. B64, 189 (1986), disclose a superconducting phase in the La-Ba-Cu-O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys. Rev. Lett. 58, 408 (1987), Bednorz et al., Europhys. Lett. 3, 379 (1987)]. The superconducting phase has been identified as the composition $La_{1-x}(Ba,Sr,Ca)_xCuO_{4-y}$ with the tetragonal $K_2NiF_4$-type structure and with x typically about 0.15 and y indicating oxygen vacancies.

Wu et al., Phys. Rev. Lett. 58, 908 (1987), disclose a superconducting phase in the Y-Ba-Cu-O system with a superconducting transition temperature of about 90 K. Cava et al., Phys. Rev. Lett. 58, 1676 (1987), have identified this superconducting Y-Ba-Cu-O phase to be orthorhombic, distorted, oxygen-deficient perovskite $YBa_2Cu_3O_{9-d}$ where d is about 2.1 and present the powder x-ray diffraction pattern and lattice parameters.

C. Michel et al., Z. Phys. B-Condensed Matter 68, 421 (1987), disclose a novel family of superconducting oxides in the Bi-Sr-Cu-O system with composition close to $Bi_2Sr_2Cu_2O_{7+d}$. A pure phase was isolated for the composition $Bi_2Sr_2Cu_2O_{7+d}$. The X-ray diffraction pattern for this material exhibits some similarity with that of perovskite and the electron diffraction pattern shows the pervoskite subcell with the orthorhombic cell parameters of a = 5.32 A (0.532 nm), b = 26.6 A (2.66 nm) and c = 48.8 A (4.88 nm). The material made from ultrapure oxides has a superconducting transition with a midpoint of 22 K. as determined from resistivity measurements and zero resistance below 14 K. The material made from commercial grade oxides has a superconducting transition with a midpoint of 7 K.

H. Maeda et al., Jpn. J. Appl. Phys. 27, L209 (1988), disclose a superconducting oxide in the Bi-Sr-Ca-Cu-O System with the composition near $BiSrCaCu_2O_x$ and a superconducting transition temperature of about 105 K.

The commonly assigned application, "Superconducting Metal Oxide Compositions and Process For Making Them", Ser. No. 153 107, filed Feb. 8, 1988, now abandoned a continuation-in-part of Ser. No. 152,186, filed Feb. 4, 1988, now abandoned disclose superconducting compositions having the nominal formula $Bi_aSr_bCa_cCu_3O_x$ wherein a is from about 1 to about 3, b is from about ⅜ to about 4, c is from about 3/16 to about 2 and x = (1.5 a+b+c+y) where y is from about 2 to about 5, with the proviso that b+c is from about 3/2 to about 5, said compositions having superconducting transition temperatures of about 70 K. or higher. It also discloses the superconducting metal oxide phase having the formula $Bi_2Sr_{3-z}Ca_zCu_2O_{8+w}$ wherein z is from about 0.1 to about 0.9, preferably 0.4 to 0.8 and w is greater than zero but less than about 1. M. A. Subramanian et al., Science 239, 1015 (1988) also disclose the $Bi_2Sr_{3-z}Ca_zCu_2O_{8+w}$ superconductor.

Y. Yumada et al., Jpn. J. Appl. Phys. 27, L996 (1988), disclose the substitution of Pb for Bi in the series $Bi_{1-x}Pb_xSrCaCu_2O_y$ where x = 0, 0.1, 0.3, 0.5, 0.7, 0.9 and 1.0. The $T_c$ increases from 75.5 K. for x = 0, no Pb present, to a maximum of 85.5 K. for x = 0.5. $T_c$ decreases for higher Pb content to 76 K. for x = 0.7. No superconductivity was observed for the samples with x = 0.9 and x = 1.

M. Takano et al., Jpn. J. Appl. Phys. 27, L1041 (1988), disclose that partial substitution of Pb for Bi in the Bi-Sr-Ca-Cu-O system results in an increase in the volume fraction of the high $T_c$ phase. Coprecipitated oxalates containing the relevant ions in various ratios underwent thermal decomposition below 773 K. The samples in powder form were then heated in air to 1073 K. for 12 hours and, after being formed into pellets, at 1118 K. for various periods which extended to more than 240 hours in some cases. A starting composition of Bi:Pb:Sr:Ca:Cu = 0.7:0.3:1:1:8 was heated at 1118 K. for 244 hours. The high-$T_c$ phase shows an onset of superconductivity at around 115 K. This phase forms plate-like crystals and analysis of these crystals indicates that the cationic ratio is Bi:Pb:Sr:Ca:Cu = 67:5:100:85:180 so that there is considerably less Pb in the high-$T_c$ than in the starting material.

M. Mizuno et al., Jpn. J. Appl. Phys. 27, L1225 (1988), also disclose that the addition of Pb to the Bi-Sr-Ca-Cu-O system results in an increase in the volume fraction of the high-$T_c$ phase and a lowering of the optimum temperature to obtain this phase to about 855° C.

E. V. Sampathkumaran et al., J. Phys. F: Met. Phys. 18, L163 (1988) disclose that the partial substitution of K or Pb for Bi in the $Bi_4Ca_3Sr_3Cu_4O_4$ results in an enhancement of the fraction of the phase superconducting at about 110 K.

Z. Z. Sheng et al., Nature 332, 55 (1988) disclose superconductivity in the Tl-Ba-Cu-O system in samples which have nominal compositions $Tl_2Ba_2Cu_3O_{8+x}$ and $TlBaCu_3O_{5.5+x}$. Both samples are reported to have onset temperatures above 90 K. and zero resistance at 81 K. The samples were prepared by mixing and grinding appropriate amounts of $BaCO_3$ and CuO with an agate mortar and pestle. This mixture was heated in air at 925° C. for ore than 24 hours with several intermediate grindings to obtain a uniform black oxide Ba-Cu oxide powder which was mixed with an appropriate amount of $Tl_2O_3$, completely ground and pressed into a pellet with a diameter of 7 mm and a thickness of 1-2 mm. The pellet was then put into a tube furnace which had been heated to 880°-910° C. and was heated for 2-5 minutes in flowing oxygen. As soon as it had slightly melted, the sample was taken from the furnace and quenched in air to room temperature. It was noted by visual inspection that $Tl_2O_3$ had partially volatilized as black smoke, part had become a light yellow liquid, and part had reacted with Ba-Cu oxide forming a black, partially melted, porous material.

Z. Z. Sheng et al., Nature 332, 138 (1988) disclose superconductivity in the Tl-Ca-Ba-Cu-O system in samples which have nominal compositions $Tl_2Ca_2BaCu_3O_{9+x}$.

R. M. Hazen et al., Phys. Rev. Lett. 60, 1657 (1988), disclose two superconducting phases in the Tl-Ba-Ca-Cu-O system, $Tl_2Ba_2Ca_2Cu_3O_{10}$ and $Tl_2Ba_2CaCu_2O_8$.

The commonly assigned application, "Superconducting Metal Oxide Compositions and Process For Making Them", Ser. No. 153,107, filed Feb. 8, 1988, a continuation-in-part of Ser. No. 152,186, filed Feb. 4, 1988, disclose superconducting compositions having the nominal formula $Tl_e Pb_a Ca_b Sr_c Cu_d O_x$ wherein a is from about 1/10 to about 3/2, b is from about 1 to about 4, c is from about 1 to about 3, d is from about 1 to about 5, e is from about 3/10 to about 1 and $x=(a+b+c+d+e+y)$ where y is from about ½ to about 3. Preferably, the sum of $a+e$ is about 1, b is about 2, c is about 2, d is from about 3 to about 4 and y is from about ½ to about 2. The onset of superconductivity for these compositions is at least 70 K. The composition wherein $e=a=\frac{1}{2}$, $b=c=2$ and $d=3$ is essentially single phase and has an onset of superconductivity at about 120 K.

P. Halder et al., Mater. Lett. 7, 1 (1988) disclose the superconductor $(Tl,Bi)(Sr,Ca)_2CuO_{4.5+\delta}$ with an onset of superconductivity of 50 K.

P. Haldar et al., J. Superconduct. 1, 211 (1988) disclose the superconductor $(Tl_{0.75}Bi_{0.25})_{1.33}Sr_{1.33}Ca_{1.3-3}Cu_2O_{6.67+\delta}$ with the ideal stoichiometry $(Tl,Bi)_1Sr_2Ca_1Cu_2O_{6.5+\delta}$ and an onset of superconductivity at 92 K. The material was prepared by mixing the constituent metal oxides and firing them at 850° C. for 12 hours in flowing oxygen, followed by slow cooling to room temperature.

K. Chen et al., J. Appl. Phys. 65, 3574 (1989) report on intragrain critical current measurements in $(Tl_{0.75}Bi_{0.25})_{1.33}Sr_{1.33}Ca_{1.33}Cu_2O_{6.67+\delta}$. The sample as prepared in the following manner. Appropriate amounts of $Tl_2O_3$, $Bi_2O_3$, CaO, SrO and CuO were mixed, pressed into a pellet and annealed at 870° C. for 12 hours in flowing oxygen.

Li et al., Physica C 157, 365 (1989) disclose the preparation of $(Tl,Bi)Sr_2CaCu_2O_y$ where the ratio of Tl/Bi was about 1, y was about 7 and the $T_c$ was about 95 K. A mixture of $Bi_2O_3$, $Sr(NO_3)_2$, CuO, $CaO_2$ and $Sr_4Tl_2O_7$ was preheated in a furnace at 800° C. for 30 minutes. The powder samples were then ground, pressed into pellets and then sintered at 850° C. in air for two hours. Single phase samples were also prepared with starting materials wrapped in gold foil and sealed in a quartz tube in air. Because of the evaporation of $Tl_2O_3$ during the preparation and the corresponding loss of Tl, the ratio of Tl/Bi in the product is close to 1 but is not known exactly. They report that significant variation of the Tl/Bi ratio from 1 resulted in the formation of great amounts of impurity phases.

There has been no disclosure of a mixed Tl-Bi copper oxide superconductor with $T_c$ above 95 K. It is believed that the present mixed Tl-Bi copper oxide superconductors have three consecutively stacked $CuO_2$ layers.

SUMMARY OF THE INVENTION

This invention provides novel single phase superconducting compositions having the formula $Tl_{1-x}Bi_xSr_2Ca_2Cu_3O_9$ wherein x is from about 3/20 to about 11/20. The onset of superconductivity for these compositions is above 110 K. A preferred range for x is from about 1/5 to about ½.

These superconducting compositions are prepared by heating a mixture of the Tl, Bi, Sr, Ca and Cu oxides, the relative amounts chosen so that the atomic ratio Tl:Bi:Ca:Sr:Cu is (1-x):x:2:2:3, at a temperature of about 850° C. to about 890° C. for about 3 to 12 hours in a controlled environment, e.g., in a sealed tube made of a non-reacting metal such as gold, said sealed tube serving to prevent the escape of the metals and the oxygen, with the proviso that when x is greater than 2/5, the temperature must be from about 865° C. to about 875° C. The heating temperature is preferably about 870° C.

BRIEF DESCRIPTION OF THE DRAWINGS

FIG. 4 shows the d-spacings obtained from the powder pattern of FIG. 3.

DETAILED DESCRIPTION OF THE INVENTION

Figure 1:
FIG. 1 shows a plot of the flux excluded by a composition of the formula $Tl_{0.5}Bi_{0.5}Sr_2Ca_2Cu_3O_9$ as a function of temperature.

The superconducting compositions of this invention are prepared by the following process. Quantities of the oxide reactants $Tl_2O_3$, $Bi_2O_3$, $SrO_2$, $CaO_2$ and CuO are chosen to provide an atomic ratio of Tl:Bi:Sr:Ca:Cu of (1-x):x:2:2:3, and mixed, for example, by grinding them together in a mortar. The mixed powder may then be heated directly or it can be first formed into a pellet or other shaped object and then heated. The superconducting composition of this invention is produced only when the environment in which the reactants are heated is carefully controlled. This controlled environment must prevent (1) the escape of the metals and the oxygen and (2) their reaction with other elements. One way to provide a controlled environment is to place the reactants in an air-filled container, e.g. a tube, made of a non-reacting metal such as gold and then seal the tube by welding. The sealed tube is then placed in a furnace and heated to about 850° C. to about 890° C. for about 3 to 12 hours. The sealed tube is then cooled to ambient temperature. For example, the power to the furnace is turned off and the tube is furnace-cooled to ambient temperature, about 20° C., and then removed from the furnace. The tube is then opened and the black product recovered. The compositions prepared in this manner exhibit the onset of superconductivity at temperatures about 110 K. It should be emphasized that when "x" is greater than 2/5, the temperature must be from about 865° C. to about 875° C.

The lattice parameters of these superconducting compositions have been determined from X-ray diffraction powder pattern results indexed on a tetragonal unit cell. The lattice parameter $a \approx 0.38$ nm for all permitted values of x. The lattice parameter c increases as x increases; $c \propto 1.52$ nm for x up to about 7/20 and 1.53 nm for the higher values of x within the permitted range.

It is to be understood that the compositions of this invention include those compositions in which the amount of oxygen per formula unit deviates somewhat from the 9 indicated by the formula $Tl_{1-x}Bi_xSr_2Ca_2Cu_3O_9$ but which are single phase superconducting compositions with tetragonal unit cell parameters consistent with those given above. Typically, such deviations in the amount of oxygen would be less than about 5% of the amount of oxygen indicated by the given formula. The compositions of this invention also include those compositions in which the atomic ratio of the metals Sr:Ca:Cu varies somewhat from 2:2:3 as given by the formula $Tl_{1-x}Bi_xSr_2Ca_2Cu_3O_9$. For example, the atomic ratio of Sr:Ca can deviate by small amounts from 1 as long as the atomic ratio of (Sr+Ca):Cu is 4:3.

Superconductivity can be confirmed by observing magnetic flux exclusion, i.e., the Meissner effect. This effect can be measured by the method described in an article by E. Polturak and B. Fisher in Physical Review B, 36, 5586(1987).

The superconductor compositions of this invention can be used to conduct current extremely efficiently or to provide a magnetic field for magnetic imaging for medical purposes or for particle accelerators. Thus, by cooling the composition in the form of a wire or bar to a temperature below the superconducting transition temperature ($T_c$), by exposing the material to liquid nitrogen or to liquid helium in a manner well known to those in this field, and initiating a flow of electrical current, one can obtain such flow without any electrical resistive losses. To provide exceptionally high magnetic fields with minimal power losses, the wire mentioned previously could be wound to form a coil or solenoid which would be exposed to liquid helium or liquid nitrogen before inducing any current into the coil. Such fields can also be used to levitate objects as large as railroad cars. These superconducting compositions are also useful in thin film-based Josephson devices such as SQUIDS (superconducting quantum interference devices) and in instruments that are based on the Josephson effect such as high speed sampling circuits and voltage standards.

EXAMPLES OF THE INVENTION

EXAMPLE 1

Quantities of $Tl_2O_3$ (1.1419 g), $Bi_2O_3$ (1.1649 g), $SrO_2$ (2.3924 g), $CaO_2$ (1.4416 g) and CuO (2.3862 g) corresponding to a Tl:Bi:Sr:Ca:Cu atomic ratio of 1/2:1/2:2:2:3 were thoroughly ground together in an agate mortar for about 30 minutes. Pellets, 10 mm in diameter and about 3 mm thick, were pressed from this mixed powder. Two pellets were loaded in air into a gold tube ($\frac{1}{2}''$ dia) and the tube was sealed by welding both ends. The tube was placed in a furnace and heated at a rate of about 5° C. per minute to 870° C. and then held at 870° C. for 4 hours. Power to the furnace was then shut off and the tube was allowed to cool to room temperature in the furnace. The tube was then removed from the furnace and cut open. The black product was recovered.

Meissner effect measurements were carried out and the results are shown in FIG. 1 where the flux exclusion is plotted as a function of temperature. The plot shows the onset of superconductivity at about 115 K.

The X-ray diffraction powder pattern shows that the product was essentially single phase. The lattice parameters $a \approx 0.38$ nm and $c \approx 1.53$ nm for this $Tl_{0.5}Bi_{0.5}Sr_2Ca_2Cu_3O_9$ product were determined from the X-ray diffraction powder pattern results indexed on a tetragonal unit cell.

EXAMPLE 2

Quantities of $Tl_2O_3$ (1.3702 g), $Bi_2O_3$ (0.9319 g), $SrO_2$ (2.3924 g), $CaO_2$ (1.4416 g) and CuO (2.3862 g) corresponding to a Tl:Bi:Sr:Ca:Cu atomic ratio of 3/5:2/5:2:2:3 were thoroughly ground together in an agate mortar for about 30 minutes. Pellets, 10 mm in diameter and about 3 mm thick, were pressed from this mixed powder. Two pellets were loaded into a gold tube ($\frac{1}{2}''$ dia) and the tube was sealed by welding both ends. The tube was placed in a furnace and heated at a rate of about 5° C. per minute to 870° C. and then held at 870° C. for 4 hours. Power to the furnace was then shut off and the tube was allowed to cool to room temperature in the furnace. The tube was then removed from the furnace and cut open. The black product was recovered.

Meissner effect measurements were carried out and the results showed an onset of superconductivity at about 115 K.

Figure 3:
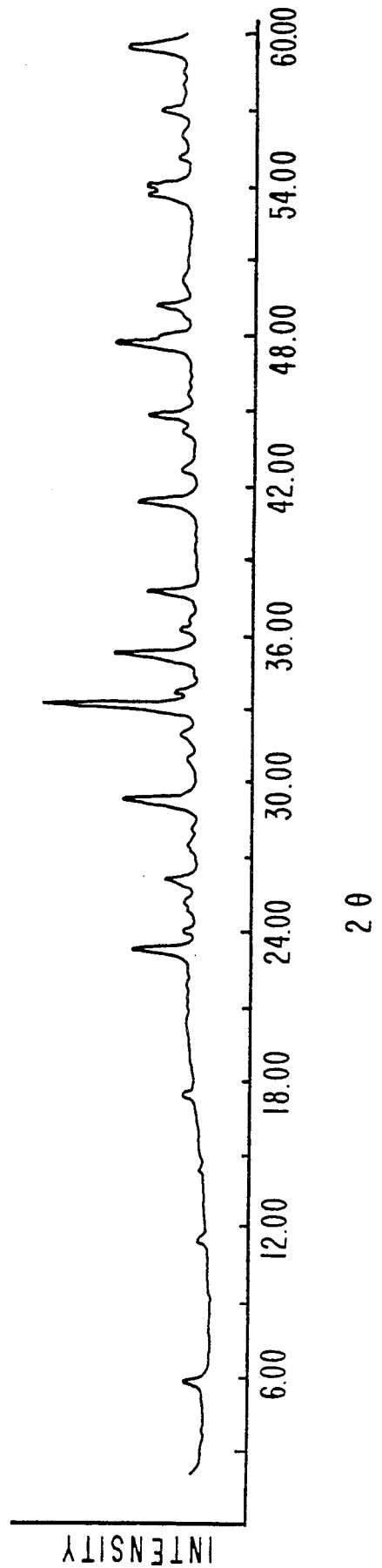
FIG. 3 shows an X-ray diffraction powder pattern for the material of Example 2.

FIG. 3 shows an X-ray diffraction powder pattern for the material of this example, and FIG. 4 shows the d-spacings obtained from the powder pattern.

The X-ray diffraction powder pattern of the product showed that the product was essentially single phase. The lattice parameters $a \approx 0.38$ nm and $c \approx 1.53$ nm for this $Tl_{0.6}Bi_{0.4}Sr_2Ca_2Cu_3O_9$ produce were determined from the X-ray diffraction powder pattern results indexed on a tetragonal unit cell.

EXAMPLE 3

Figure 2:
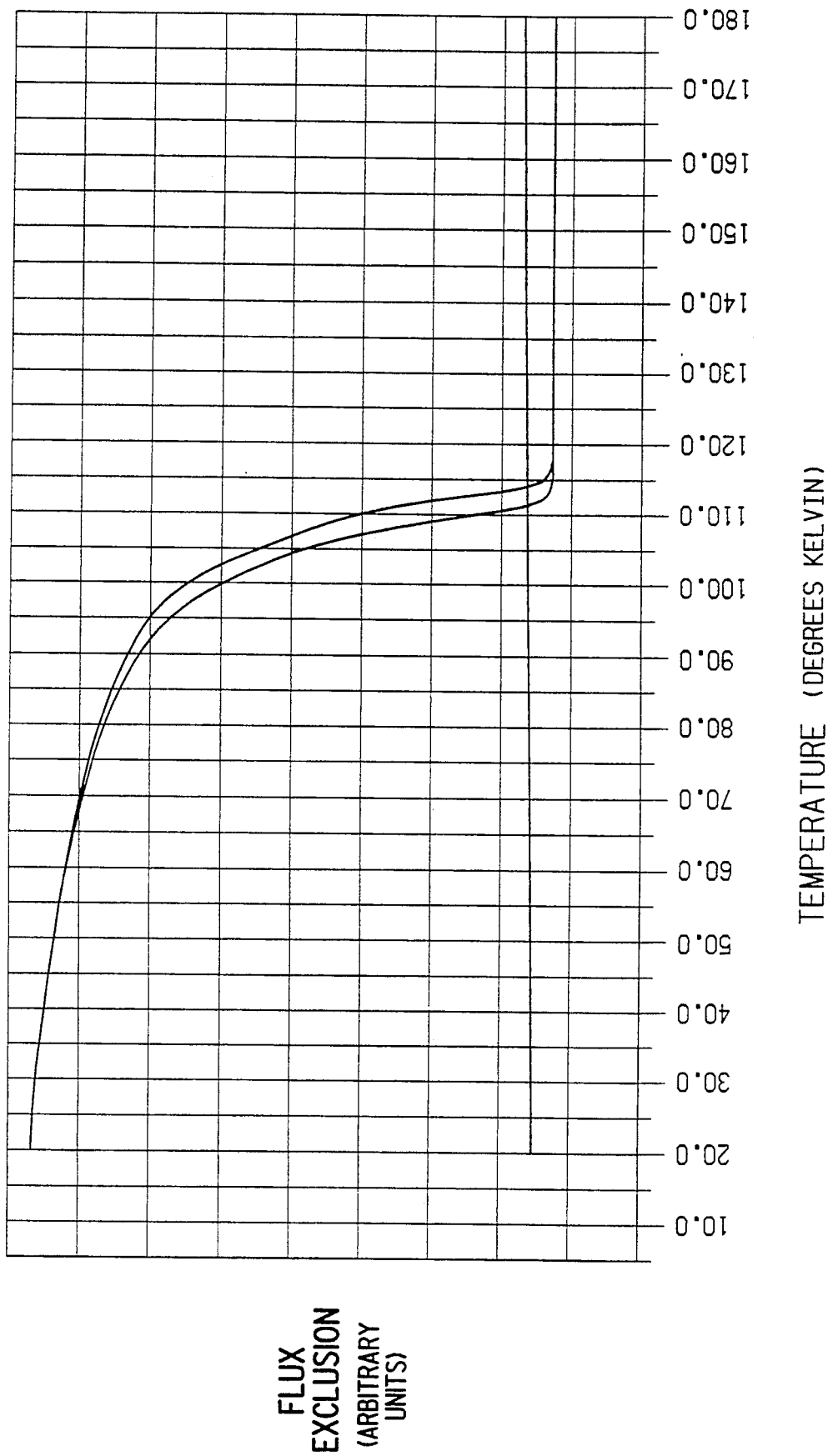
FIG. 2 shows a plot of the flux excluded by a composition of the formula $Tl_{0.6}Bi_{0.4}Sr_2Ca_2Cu_3O_9$ as a function of temperature.

Two other pellets of the mixed powder of Example 2 were treated as described in Example 2 except that the temperature to which they were heated was 890° C. and they were then held at 890° C. for 3 hours Meissner effect measurements were carried out and the results are shown in FIG. 2 where the flux exclusion is plotted as a function of temperature. The plot shows the onset of superconductivity at about 115 K.

An X-ray diffraction powder pattern of the product showed that the product was essentially single phase. The lattice parameters $a \approx 0.38$ nm and $c \approx 1.53$ nm for this $Tl_{0.6}Bi_{0.4}Sr_2Ca_2Cu_3O_9$ product were determined from the X-ray diffraction powder pattern results indexed on a tetragonal unit cell.

EXAMPLE 4

Quantities of $Tl_2O_3$ (1.8270 g), $Bi_2O_3$ (0.4660 g), $SrO_2$ (2.3924 g), $CaO_2$ (1.4416 g) and CuO (2.3862 g) corresponding to a Tl:Bi:Sr:Ca:Cu atomic ratio of 4/5:1/5:2:2:3 were thoroughly ground together in an agate mortar for about 30 minutes. Pellets, 10 mm in diameter and about 3 mm thick, were pressed from this mixed powder. Two pellets were loaded in air into a gold tube ($\frac{1}{2}''$ dia) and the tube was sealed by welding both ends. The tube was placed in a furnace and heated at a rate of about 5° C. per minute to 890° C. and then held at 890° C. for 3 hours. Power to the furnace was then shut off and the tube was allowed to cool to room temperature in the furnace. The tube was then removed from the furnace and cut open. The black product was recovered.

Meissner effect measurements were carried out and the results showed an onset of superconductivity at about 115 K.

An X-ray diffraction powder pattern of the product showed that the product was essentially single phase. The lattice parameters $a \approx 0.38$ nm and $c \approx 1.52$ nm for this $Tl_{0.8}Bi_{0.2}Sr_2Ca_2Cu_3O_9$ product were determined from the X-ray diffraction powder pattern results indexed on a tetragonal unit cell.

EXAMPLE 5

Quantities of $Tl_2O_3$ (1.5986 g), $Bi_2O_3$ (0.6989 g), $SrO_2$ (2.3924 g), $CaO_2$ (1.4416 g) and CuO (2.3862 g) corresponding to a Tl:Bi:Sr:Ca:Cu atomic ratio of 7/10:3/10:2:2:3 were thoroughly ground together in an agate mortar for about 30 minutes. Pellets, 10 mm in diameter and about 3 mm thick, were pressed from this mixed powder. Two pellets were loaded in air into a gold tube (½″ dia) and the tube was sealed by welding both ends. The tube was placed in a furnace and heated at a rate of about 5° C. per minute to 850° C. and then held at 850° C. for 6 hours. Power to the furnace was then shut off and the tube was allowed to cool to room temperature in the furnace. The tube was then removed from the furnace and cut open. The black product was recovered.

Meissner effect measurements were carried out and the results showed an onset of superconductivity at about 112 K.

An X-ray diffraction powder pattern of the product showed that the product was essentially single phase. The lattice parameters $a \approx 0.38$ nm and $c \approx 1.52$ nm for this $Tl_{0.7}Bi_{0.3}Sr_2Ca_2Cu_3O_9$ product were determined from the X-ray diffraction powder pattern results indexed on a tetragonal unit cell.

The invention being claimed is:

1. A single phase superconducting composition having the formula $Tl_{(1-x)}Bi_xSr_2Ca_2Cu_3O_9$ wherein x is from about 3/20 to about 11/20 with the onset of superconductivity occurring at about 110° K.

2. The single phase composition of claim 1 wherein x is from about 1/5 to about ½.

3. The single phase composition of claim 2 having the formula $Tl_{0.5}Bi_{0.5}Sr_2Ca_2Cu_3O_9$.

4. The single phase composition of claim 2 having the formula $Tl_{0.6}Bi_{0.4}Sr_2Ca_2Cu_3O_9$.

5. The single phase composition of claim 2 having the formula $Tl_{0.7}Bi_{0.3}Sr_2Ca_2Cu_3O_9$.

6. The single phase composition of claim 2 having the formula $Tl_{0.8}Bi_{0.2}Sr_2Ca_2Cu_3O_9$.

7. A process for making a single phase composition having the formula $Tl_{1-x}Bi_xSr_2Ca_2Cu_3O_9$ wherein x is from about 3/20 to about 11/20, said process consisting essentially of a) forming an oxide mixture of the oxides of Tl, Bi, Sr, Ca and Cu, the relative amounts chosen so that the atomic ratio Tl:Bi:Ca:Sr:Cu is 1-x:x:2:2:3;

b) heating said oxide mixture at a temperature of about 850° C. to about 890° C. for about 3 to 12 hours in a sealed, nonreactive container to form said composition, with the proviso that when x is greater than 2/5, the temperature is from about 865° C. to about 875° C.; and c) cooling and recovering said composition.

8. The process of claim 7 wherein the oxides are $Tl_2O_3$, $Bi_2O_3$, $SrO_2$, $CaO_2$ and CuO.

9. The process of claim 7 wherein the temperature to which the oxide mixture is heated is 870° C.

* * * * *